(12) United States Patent
Aigner et al.

(10) Patent No.: US 6,310,280 B1
(45) Date of Patent: Oct. 30, 2001

(54) ELECTRIC VOLTAGE SOURCE FOR SEMICONDUCTOR COMPONENTS

(75) Inventors: Robert Aigner; Christofer Hierold, both of München; Frank Schmidt, Pöring, all of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/403,185

(22) PCT Filed: Apr. 7, 1998

(86) PCT No.: PCT/DE98/00982

§ 371 Date: Oct. 18, 1999

§ 102(e) Date: Oct. 18, 1999

(87) PCT Pub. No.: WO98/48463

PCT Pub. Date: Oct. 29, 1998

(30) Foreign Application Priority Data

Apr. 18, 1997 (DE) ............................................. 197 16 343

(51) Int. Cl.[7] .................................................. H01L 35/28
(52) U.S. Cl. ........................... 136/228; 136/203; 136/242
(58) Field of Search ..................................... 136/203, 205, 136/242, 228

(56) References Cited

U.S. PATENT DOCUMENTS

| 5,156,688 | * | 10/1992 | Buhler et al. | 136/211 |
| 5,956,569 | * | 9/1999 | Shiu et al. | 136/203 |

FOREIGN PATENT DOCUMENTS

| 1 082 311 | | 11/1960 | (DE) . |
| 1 391 214 | | 4/1975 | (GB) . |
| 8204242 | * | 8/1996 | (JP) . |
| 08-204 242 | | 8/1996 | (JP) . |

OTHER PUBLICATIONS

PCT International Search Report, Jun. 1999.*

* cited by examiner

Primary Examiner—Kathryn Gorgos
Assistant Examiner—Thomas H Parsons
(74) Attorney, Agent, or Firm—Schiff Hardin & Waite

(57) ABSTRACT

A semiconductor component comprising a layer of semiconductor material that is doped region-by-region in alternating fashion for positive and negative electrical conductivities. This layer is arranged perpendicular to layer surfaces between thermally conductive layers in such a way that the junctions between two successive regions having different electrical conductivities are electrically insulated outwardly, and are alternately in thermal contact with one of the thermally conductive layers and are thermally insulated from the respective other thermally conductive layer.

6 Claims, 2 Drawing Sheets

US 6,310,280 B1

ELECTRIC VOLTAGE SOURCE FOR SEMICONDUCTOR COMPONENTS

FIELD OF THE INVENTION

The present invention pertains to the field of semiconductor components, particularly semiconductor thermoelectric components.

DESCRIPTION OF THE RELATED ART

The present invention relates to a semiconductor component as a thermoelement or Peltier element that converts temperature differences into electrical differences in potential and vice versa, exploiting the thermoelectric effect (Seebeck-Peltier effect).

Sensors that can be interrogated telemetrically are superior to conventional systems in a large number of applications. In systems having a large number of sensors, or having measurement points that are difficult to access or are very small, the cost of signal transmission can be reduced significantly using telemetric sensors. Passive telemetric sensors require no energy storage device on the actual sensor, but are limited in functionality and range. Active telemetric sensors based on CMOS technology permit the construction of intelligent systems at a low cost per measurement point. Up to now, one disadvantage has been the necessity of a battery as an energy source in each sensor. The battery requires an expense, limits the useful life, and has to be disposed of separately afterwards. In modem low-power circuits, the power required for the operation of the sensor is very low; somewhat higher power is briefly required only for the signal transmission.

Peltier elements enable the direct conversion of thermal energy to electrical energy. The removal of thermal energy is always possible when heat reservoirs are available at various temperatures. For example, a body having an elevated temperature, and temperature gradient thereof to the surroundings, is sufficient to obtain electrical energy.

The flow of power in a thermoelement depends on the material and geometric parameters, as well as on the electrical current at the junction.

The Seebeck coefficient S (measured in V/K) describes the contact voltage per Kelvin of a material in relation to a reference material.

FIG. 2 shows an equivalent switching diagram of a Peltier element. The Peltier coefficient $\pi_{pn}$ (measured in W/A) describes the heat transport caused by electrical current. If two different materials with different doping (p, n) are joined, the contact voltage per Kelvin is calculated from the difference of the two Seebeck coefficients. The heat transport corresponds to this difference multiplied by the temperature T (measured in K) of the respective junction.

$$\pi_{pn}=T(S_p-S_n) \quad \text{(Eq. 1.1)}$$

A Peltier element standardly consists of a number m of junctions that are connected in parallel thermally but in series electrically. The warm (H) and cold (I) junctions are not ideally insulated from one another thermally; there exists a heat conductance value $K_{thHL}$ that effects a loss, since the relevant quantity of heat for the conversion is lost, where $K_{thHL}$ is the heat conductance value. $T_{amb}$ and $T_{source}$ designate the ambient temperature and the source temperature, respectively. $T_H$ and $T_L$ designate the warm or high temperature, and the cold or low temperature, respectively. Additional losses arise because the electrical current in the junctions and in the regions in between produces ohmic power loss. This power loss $I^2_{el} R_i$ can be distributed symmetrically to (H) and (L).

The flow of heat into the two heat current sources results according to the following:

$$P_H = mS_{pn}T_H I_{el} + \frac{I^2_{el}R_i}{2} \quad \text{(Eq. 1.2)}$$

$$P_L = -mS_{pn}T_L I_{el} + \frac{I^2_{el}R_i}{2} \quad \text{(Eq. 1.3)}$$

The no-load voltage at the terminals ($I_{el}$=0) depends in linear fashion on the temperature difference between (H) and (L).

$$U_0=mS_{pn}(T_H-T_L) \quad \text{(Eq. 1.4)}$$

The electrical internal resistance results from the specific resistances $\rho_p$, $\rho_n$ of the materials, the geometry and the number m of elements.

$$R_i = m\left(\frac{\rho_p l_p}{A_p} + \frac{\rho_n l_n}{A_n}\right) \quad \text{(Eq. 1.5)}$$

Here $A_p$, $A_n$=cross-sectional surface of the individual element in m², $l_p$, $l_n$=length between (H) and (L) in m.

The heat conductance value $K_{thNL}$ follows correspondingly from the specific heat conductance values $\lambda_p$, $\lambda_n$ and the geometry.

$$K_{thHL} = m\left(\frac{\lambda_p A_p}{l_p} + \frac{\lambda_n A_n}{l_n}\right) \quad \text{(Eq. 1.6)}$$

The output voltage of the Peltier element is:

$$U_{out}=mS_{pn}(T_H-T_L)-R_i I_{el}=U_0-R_i I_{el} \quad \text{(Eq. 1.7)}$$

The output power of the Peltier element is $$P_{out}=mS_{pn}(T_H-T_L)I_{el}-R_i I^2_{el} \quad \text{(Eq. 1.8)}$$

The maximum output power of a Peltier element (with ideal heat sinks $K_{th1}$, $K_{th2} \to \infty$) results as:

$$P_{out\max} = \frac{m^2 S^2_{pn}(T_H - T_L)^2}{4 R_i} \quad \text{(Eq. 1.9)}$$

The following expression is used as a "figure of merit":

$$Z = \frac{m^2 S^2_{pn}}{R_i K_{thHL}} \quad \text{(Eq. 1.10)}$$

By substitution of (1.5) and (1.6) and optimization of the geometry, the following is obtained:

$$Z_{\max} = \frac{S^2_{pn}}{\left(\sqrt{\lambda_p \rho_p} + \sqrt{\lambda_n \rho_n}\right)^2} \quad \text{with} \quad \frac{A_p l_n}{A_n l_p}\sqrt{\frac{\rho_p \lambda_n}{\rho_n \lambda_p}} \quad \text{(Eq. 1.11)}$$

If the heat conductivities and specific resistances of the materials are equal, Z is independent of the geometry. Peltier elements that are of interest technologically have $Z > 10^{-3}$ K$^{-1}$.

The expected temperature differences at the heat junctions are small. Despite progress in low voltage circuit technology, circuits require a supply voltage of at least 1 to 1.5 V, although 3 to 5 V is optimal; these can then be DC-converted as needed, with a high degree of efficiency. Through series connection of a large number of heat junctions, a sufficient voltage can be produced even given low temperature differences, but this increases the internal resistance of the thermogenerator, and finally limits the output voltage. The target design must be composed of elementary cells that are as small as possible, in order to ensure sufficient degrees of freedom for the adaptation of the output voltage.

The price of the thermogenerator is proportional to the chip surface. The achievable power depends on the chip surface, the thermal relations and material parameters. In order to determine a guide value for the desired power, the following observation should be taken into account:

A small button cell (1.5 V) has a capacity of approximately 50 mAh and an energy content of less than 0.1 J. If an operational life of only one year is assumed, an average power drain of only 3 nW is permissible. A lithium photo-battery with 3 V has a capacity of 1.3 Ah and an energy content of 4 J. Given an operating life of one year, there results a permissible average power drain of 0.13 $\mu$W. The average power requirement of circuits in which batteries are to be replaced by thermogenerators is thus very low. While batteries can unproblematically emit higher power for a short period of time, for these cases a thermogenerator (depending on the design) must be supplemented by an energy storage unit. Besides the average power, the power required for brief periods is thus also a dimensioning criterion.

SUMMARY OF THE INVENTION

It is an object of the present invention to provide a semiconductor thermoelement arrangement that converts temperature differences into electrical differences in potential and vice-versa.

These objects are achieved in accordance with the invention in a semiconductor thermoelement arrangement including a doped layer of semiconductor material having a first side and a second side and having contiguous regions. The doped layer is p-doped and n-doped region-by-region in alternating fashion for positive and negative electrical conductivities. A first thermally conductive layer arranged on the first side of the doped layer in relation to a direction perpendicular to a planar extension of the doped layer. A second thermally conductive layer is arranged on the second side of the doped layer in relation to a direction perpendicular to a planar extension of the doped layer. The doped layer is in thermal contact with the first thermally conductive layer and is thermally insulated from the second thermally conductive layer at points of the doped layer at which, in a predetermined direction, there are junctions from the p-doped regions to the n-doped regions. The doped layer is in thermal contact with the second thermally conductive layer and is thermally insulated from the first thermally conductive layer at points of the doped layer at which, in a predetermined direction, there are junctions from the n-doped regions to the p-doped regions. Contacts for electrical connection are applied to the doped layer.

These objects are achieved in accordance with the invention in a semiconductor thermoelement arrangement including a doped layer of a semiconductor material having a first side and a second side and having contiguous regions. The doped layer is p-doped and n-doped region-by-region in alternating fashion for positive and negative electrical conductivities. A fist thermally conductive layer arranged on the first side of the doped layer in relation to a direction perpendicular to a planar extension of the doped layer. A second thermally conductive layer is arranged on the second side of the doped layer in relation to a direction perpendicular to a planar extension of the doped layer. The doped layer is in thermal contact with the first thermally conductive layer and is thermally insulated from the second thermally conductive layer at points of the doped layer at which, in a predetermined direction, there are junctions from the p-doped regions to the n-doped regions. The doped layer is in thermal contact with the second thermally conductive layer and is thermally insulated from the first thermally conductive layer at points of the doped layer at which, in a predetermined direction, there are junctions from the n-doped regions to the p-doped regions. Contacts for electrical connection are applied to the doped layer.

It is another object of the present invention to provide an electrical voltage source adapted to the operation of semiconductor components that enables network independent operation of telemetric sensor systems.

The inventive thermoelectric arrangement comprises a layer of semiconductor material that is doped region-by-region in alternating fashion for positive and negative conductivities. This layer is arranged perpendicular to layer surfaces between thermally conductive layers in such a way that the junctions between two successive regions with different electrical conductivities are electrically insulated outwardly, and, in alternating fashion, are in thermal contact with one of the thermally conductive layers and are thermally insulated from the respective other thermally conductive layer. Transport of charge bearers thus takes place only inside the doped layer. The junctions of the electrical conductivity in a respective direction of plus or minus are for example in thermal contact with a substrate made of semiconductor material; the junctions in this direction from minus to plus are thermally and electrically insulated from the substrate, and are in thermal contact with a thermally conductive layer (made for example of metal or semiconductor material) that is applied on the side facing away from the substrate. A temperature difference between the thermally conductive layers thus has the effect that the pn junctions (seen in a particular direction) respectively have a higher or lower temperature than the np junctions. The adjacent doped regions have thermoelectric characteristics that correspond to the joining of different materials of a thermoelectric voltage series. Electrical differences in potential are thus caused in the doped layer by the temperature differences between the pn junctions and the np junctions. If several regions doped opposite to one another follow one another in succession, the thermoelectrically produced differences in potential in the doped layer cumulate, since the pn junctions and np junctions in the layer follow one another in series. A greater difference in potential can thus be picked off at the external sides of the doped layer than is the case when only one pn or np junction is present that functions as a thermoelement with the terminal contacts applied on the doped layer. The inventive component can also be used as a Peltier element in order to produce, through the application of an electrical voltage to the sides of the doped layer, a temperature difference between the thermally conductive layers.

The term "Peltier element" designates a component that comprises a multiplicity of individual thermoelements. The term "semiconductor thermoelement arrangement" has been used as a common generic term for an inventive component that comprises one or more parts that function as a thermoelement. The inventive component can preferably be manufactured in the context of a CMOS process; however, the manufacturing is not limited to this process. The indication of the preferred manufacturing is not to be regarded as a limitation of the exemplary embodiments of the component that are to be considered inventive.

These and other features of the invention(s) will become clearer with reference to the following detailed description of the presently preferred embodiments and accompanied drawings.

DETAILED DESCRIPTION OF THE PRESENTLY PREFERRED EMBODIMENTS

Figure 1:
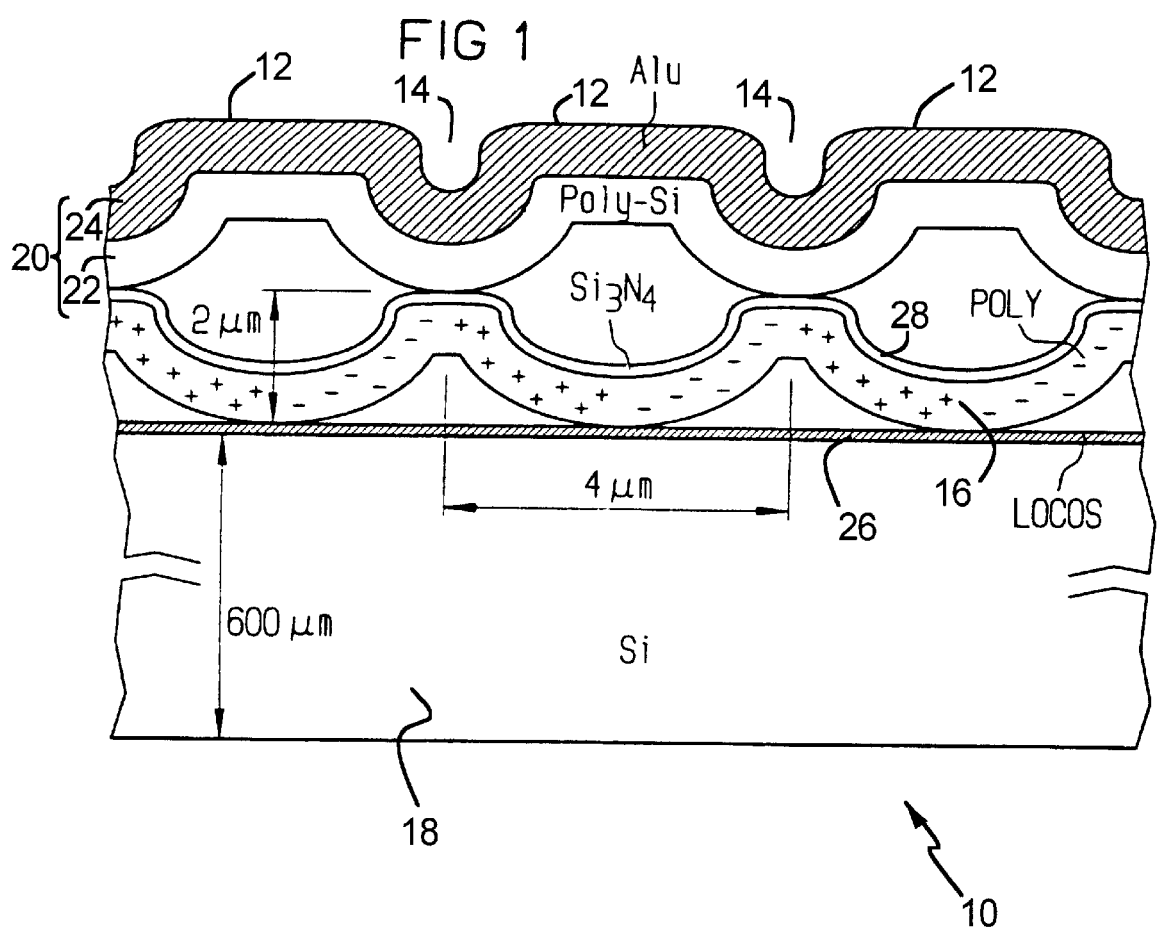
FIG. 1 is a segment of a cross-section through a semiconductor thermoelement in accordance with the present invention.

FIG. 1 shows a segment of a cross-section through an inventive component.

Figure 2:
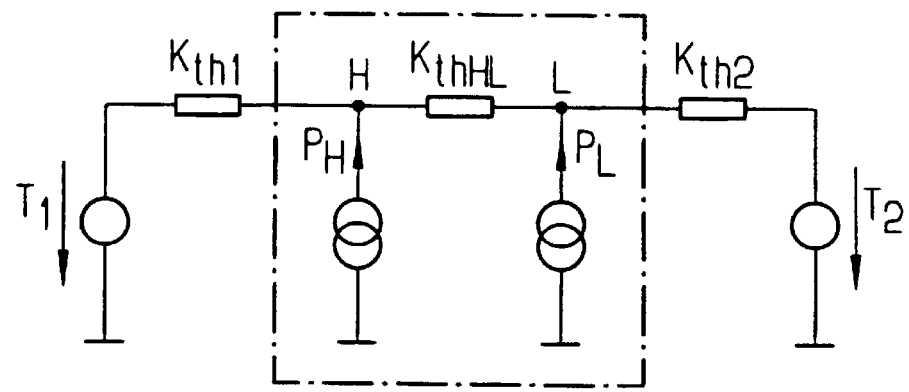
FIG. 2 is an equivalent switching diagram of a Peltier element according to the prior art.

FIG. 2 shows an equivalent switching diagram of the Peltier element explained above.

Figure 3:
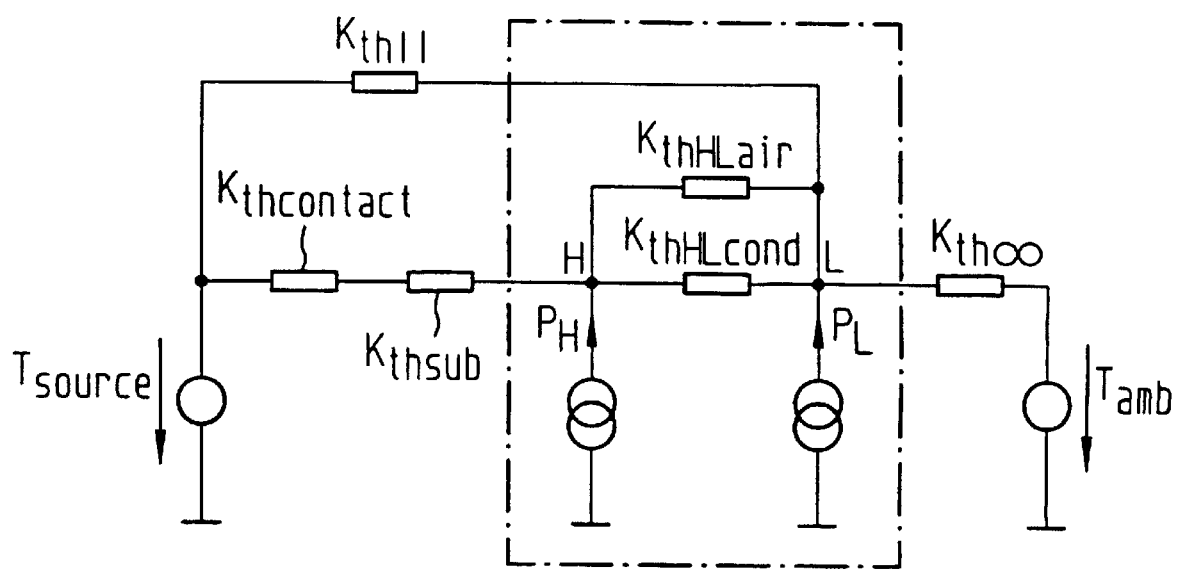
FIG. 3 is an equivalent switching diagram of the overall system.

FIG. 3 shows an equivalent switching diagram for the overall system.

The cross-section shown in FIG. 1 of an inventive semiconductor thermoelement 10 is to be understood as a typical and currently preferred specific embodiment. The depicted structure is equal in each coplanar cross-section of the semiconductor thermoelement 10 in front of or behind the plane of the drawing. The spatial structure of the semiconductor thermoelement 10 thus essentially results from a displacement of the depicted cross-section perpendicular to the plane of the drawing. The expansion of the elementary cell perpendicular to the plane of the drawing can be varied according to the number of elements required. In a top view (not shown), the thermoelectrically active regions form paths 12 in order to ensure electrical insulation. The gap 14 between the paths 12 is at least 1 $\mu$m wide. Given a path width of, for example, 3 $\mu$m, the surface of an elementary cell is 4 $\mu$m×4 $\mu$m; in this case, 62,500 elementary cells can be integrated per square millimeter of chip surface.

In this example, the doped layer 16 is polysilicon, and is characterized in the Figure by plus and minus signs that mark the differently doped layers. In the depicted embodiment, the thermally conductive layers 18 and 20 comprise a layer formed by substrate 18, which is preferably silicon here, and a double layer 20 of an additional polysilicon, layer 22 facing the doped layer 16, having a layer of aluminum 24 applied thereon. In place of this double layer 20, only one layer, made of a semiconductor material or of a metal, can be present.

For the purpose of an electrical insulation of the pn and np junctions, that is, in order to prevent a short-circuiting of the pn and np junctions by the adjacent thermally conductive layers 18 and 20, thin layers 26 and 28, respectively made of silicon oxide (LOCOS, locally oxidized silicon) and of silicon nitride ($Si_3N_4$) are present between the doped layer 16 and a respective thermally conductive layer 18 and 20. The material and the thickness of these electrical insulations are selected such that a sufficient thermal conductivity through the insulating layers 26 and 28 is provided. If the thermally conductive layers 18 and 20 insulate electrically to a sufficient degree, the additional electrically insulating layers 26 and 28 can be omitted.

The points of the doped layer 16 at which, read from left to right in FIG. 1, the p-doping (+) goes over into the n-doping (−), designated pn junctions in the following, are in thermal contact with the substrate 18, and are separated from the upper thermally conductive double layer 20 by thermally insulating intermediate regions that are preferably fashioned as hollow spaces. The points of the doped layer at which, read from left to right in the Figure, the n-doping (−) goes over into the p-doping (+), designated np junctions in the following, are in thermal contact with the upper thermally conductive double layer 20, and are separated from the substrate 18 by thermally insulating intermediate regions that are likewise preferably fashioned as hollow spaces. Partial vacuums, with correspondingly low heat conductivity, are located in the hollow spaces; the heat conductivity of the hollow space is negligible in comparison with the solid-state heat conduction of the thermoactive poly-regions.

These hollow spaces are for example manufactured in that a respective sacrificial layer, made of a material that can be etched selectively relative to the material of the provided layers, is applied, and is structured in a manner corresponding to the shape of the hollow spaces that are to be manufactured. A provided layer is applied onto the sacrificial layer, and the arrangement that converts temperature differences into electrical differences in through etching openings made in the provided layer. This procedure is used at each level for hollow spaces to be manufactured. The rippled structure of the doped layer 16 continues correspondingly to the left and to the right. At the left and right sides of the doped layer 16, contacts (not shown) are provided at which an electrical voltage can be picked off. The doped layer 16 can in principle also be flat, or rippled less strongly, if the thermally conductive layers 18 and 20 are structured sufficiently strongly. The upper (double) layer 20 can for example be rippled more strongly, while the upper side, facing the doped layer 16, of the substrate 18 is not flat, as shown in FIG. 1, but rather is likewise rippled. The dimensions indicated are to be understood only as typical examples.

The inventive semiconductor thermoelement can be used as a voltage source for an active semiconductor element, that is, a component that is to be driven with an applied electrical voltage or an injected current. It can be integrated together with semiconductor components.

FIG. 3 shows a thermal equivalent diagram of the overall system. The thermal relations in the overall system are decisive for the magnitude of the temperature difference at the Peltier element, and thus the maximum output power. The following abbreviations are used in FIG. 3:

$K_{thcontact}$=thermal contact conductance value at the heat source $K_{thsub}$=thermal conductance value through substrate thickness $K_{thHLcond}$=thermal conductance value (solid state) between (H) and (L)

$K_{thHLair}$=thermal conductance value (gas) between (H) and (L)

$K_{th\infty}$=thermal conductance value from (L) to the environment $K_{th\|}$=thermal parallel conductance value between source and (L), all measured in W/K.

These conductance values can be estimated roughly from material values. For example, for a chip surface of 4 mm×4 mm and a poly-thickness of 0.8 $\mu$m, the following are obtained:

$K_{thcontact}$=1 W/K (assumption: heat conducting paste or glue)

$K_{thsub}$=4 W/K ($\lambda_{Si,mono}$=150 W/(m·K))

$K_{thHLcond}$=80 W/K ($\lambda_{Si,poly}$=40 W/(m·K); surface portion of the thermolimb=25% of the cell)

$K_{thHLair}$=5 W/K ($\lambda_{Luft}$=0.026 W/(m·K); negligible)

$K_{th\infty}$=0.08 W/K (e.g., IC cooling element for DIL24)

$K_{th\|}$=0.1 W/K (assumption: same order of magnitude as $K_{th>}$)

The Seebeck coefficient can be determined from the electron concentrations in the contact materials. In the semiconductors used, the electron concentrations $n_p$, $n_n$ depend on the dopings $N_D$ and $N_A$.

$$S_{pn} = \frac{k}{e} \ln \frac{n_n}{n_p} = \frac{k}{e} \ln \frac{N_D N_A}{n_i^2} \quad \text{(Eq. 2.1)}$$

k=Boltzmann constant=$1.38 \cdot 10^{-23}$ J/K, e=elementary charge=$1.6 \cdot 10^{-19}$ As, $n_i$=intrinsic charge bearer density of Si=$1.5 \cdot 10^{10}$ cm$^{-3}$.

With $N_D=N_A=10^{19}$ cm$^{-3}$, there results:

$S_{pn}=3.5 \cdot 10^{-3}$ V/K.

With highly doped polysilicon (doping level>$10^{19}$ cm$^{-3}$), there results an $R_{square}$ of 10 to 20Ω. The internal resistance of the elementary cell is inversely proportional to the width (the length is determined by the technology). Given minimal width, the internal resistance is approximately 30Ω. The width is inversely proportional to the number of elements on a chip. The overall internal resistance of a thermogenerator having chip size 4 mm×4 mm results as:

$$R_i \text{ (4 mm×4 mm)} \approx m^2 \cdot 30\Omega/10^6 \quad \text{(Eq. 2.2)}$$

For the minimal cell size (m=$10^6$) the result is $R_i$=30 MΩ. The "figure of merit" from Eq. 1.10 is obtained as $$Z = \frac{m^2 S_{pn}^2}{R_i K_{thHL}} = 5 \cdot 10^{-3}$$

The power that can be achieved is extremely dependent on the cooling conditions. Given very careful estimation with small cooling elements (20 mm×10 mm×10 mm) and a chip having 4 mm×4 mm, with the estimated thermal and electrical characteristics there result output powers in the range of 60 μW and output voltages adjustable from 1 V to 10 V.

Although modifications and changes may be suggested by those of ordinary skill in the art, it is the intention of the inventors to embody within the patent warranted hereon all changes and modifications as reasonably and properly come within the scope of their contribution to the art.

What is claimed is:

1. A semiconductor thermoelectric device comprising:
   a doped layer of semiconductor material having a first side and a second side and having contiguous regions, said doped layer being polysilicon and being p-doped and n-doped region-by-region in alternating fashion for positive and negative electrical conductivities;
   a first thermally conductive layer arranged on said first side of said doped layer in relation to a direction perpendicular to a planar extension of said doped layer;
   a second thermally conductive layer arranged on said second side to said doped layer in relation to a direction perpendicular to a planar extension of said doped layer;
   said doped layer being in thermal contact with said first thermally conductive layer and being thermally insulated from said second thermally conductive layer at points of said doped layer at which, in a predetermined direction, there are junctions from said p-doped regions to said n-doped regions;
   said doped layer being in thermal contact with said second thermally conductive layer and being thermally insulated from said first thermally conductive layer at points of said doped layer at which, in a predetermined direction, there are junctions from said n-doped regions to said p-doped regions; and
   contacts for electrical connection applied to said doped layer.

2. The semiconductor thermoelement arrangement according to claim 1, wherein one of said first and second thermally conductive layers is formed by a substrate made of a semiconductor material.

3. The semiconductor thermoelement arrangement according to claim 1, wherein said doped layer is thermally insulated at said junction points from said respective first and second thermally conductive layers by hollow spaces between said doped layer and said first and second thermally conductive layers.

4. The semiconductor thermoelement arrangement according to claim 1, wherein said doped layer comprises a rippled structure.

5. A voltage source for operating a device having at least one active semiconductor component, said voltage source comprising:
   at least one semiconductor thermoelement including:
      a doped layer of semiconductor material having a first side and a second side and having contiguous regions, said doped layer being polysilicon and being p-doped and n-doped region-by-region in alternating fashion for positive and negative electrical conductivities:
      a first thermally conductive layer arranged on said first side of said doped layer in relation to a direction perpendicular to a planar extension of said doped layer;
      a second thermally conductive layer arranged on said second side of said doped layer in relation to a direction perpendicular to a planar extension of said doped layer;
      said doped layer being in thermal contact with said first thermally conductive layer and being thermally insulated from said second thermally conductive layer a points of said doped layer at which, in a predetermined direction, there are junctions from said p-doped regions to said n-doped regions;
      said doped layer being in thermal contact with said second thermally conductive layer and being thermally insulated from said first thermally conductive layer at points of said doped layer at which, in a predetermined direction, there are junctions from said n-doped regions to said p-doped regions; and
      contacts for electrical connection applied to said doped layer.

6. The voltage source according to claim 5, wherein said active semiconductor component and said at least one semiconductor thermoelement are integrated in a main substrate and are mutually electrically conductively connected, said active semiconductor component being operated by applying a temperature difference of a predetermined magnitude to said at least one semiconductor thermoelement.

* * * * *